United States Patent
Koseki et al.

(10) Patent No.: US 10,102,060 B2
(45) Date of Patent: Oct. 16, 2018

(54) STORAGE APPARATUS AND DATA CONTROL METHOD OF STORING DATA WITH AN ERROR CORRECTION CODE

(71) Applicant: Hitachi, Ltd., Tokyo (JP)

(72) Inventors: Hideyuki Koseki, Tokyo (JP); Takashi Tsunehiro, Tokyo (JP); Junji Ogawa, Tokyo (JP); Nagamasa Mizushima, Tokyo (JP); Atsushi Kawamura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 196 days.

(21) Appl. No.: 14/762,841

(22) PCT Filed: Aug. 30, 2013

(86) PCT No.: PCT/JP2013/073392
§ 371 (c)(1),
(2) Date: Jul. 23, 2015

(87) PCT Pub. No.: WO2015/029230
PCT Pub. Date: Mar. 5, 2015

(65) Prior Publication Data
US 2016/0011938 A1 Jan. 14, 2016

(51) Int. Cl.
*G06F 11/10* (2006.01)
*G11C 29/52* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
None
See application file for complete search history.

(56) References Cited

U.S. PATENT DOCUMENTS

| 8,103,936 | B2 | 1/2012 | Pekny et al. |
| 8,799,745 | B2 * | 8/2014 | Koseki ............... G06F 11/1012 714/6.1 |

(Continued)

FOREIGN PATENT DOCUMENTS

| JP | 2008-9944 A | 1/2008 |
| JP | 2012-504795 A | 2/2012 |

(Continued)

OTHER PUBLICATIONS

Japanese Office Action received in corresponding Japanese Application No. 2015-533902 dated Aug. 2, 2016.
International Search Report of PCT/JP2013/073392.

*Primary Examiner* — Justin R Knapp
(74) *Attorney, Agent, or Firm* — Mattingly & Malur, PC

(57) ABSTRACT

In a storage apparatus including a storage medium including a plurality of pages as a unit of reading and writing data, a first data block including a data block received from a higher-level device is generated, a second data block of a predetermined size including one or more undivided first data blocks is generated, a third data block in which a correction code is added to the second data block is generated, the third data block is stored in a page buffer, and one or more of the third data blocks stored in the page buffer is written in a page, which is a write destination, out of the pages of the storage medium.

9 Claims, 18 Drawing Sheets

(51) Int. Cl.
*G06F 3/06* (2006.01)
*G06F 12/04* (2006.01)
*G06F 12/16* (2006.01)
*G06F 12/02* (2006.01)

(52) U.S. Cl.
CPC ........ *G06F 3/0679* (2013.01); *G06F 11/1076* (2013.01); *G06F 12/0246* (2013.01); *G06F 12/04* (2013.01); *G06F 12/16* (2013.01); *G11C 29/52* (2013.01); *G06F 2211/1014* (2013.01); *G06F 2212/214* (2013.01); *G06F 2212/403* (2013.01); *G06F 2212/7202* (2013.01); *G06F 2212/7208* (2013.01)

(56) References Cited

U.S. PATENT DOCUMENTS

| | | | |
|---|---|---|---|
| 2008/0046778 A1 | 2/2008 | Yoshida | |
| 2009/0083476 A1* | 3/2009 | Pua | G06F 3/0613 711/103 |
| 2011/0320915 A1 | 12/2011 | Khan | |
| 2012/0096329 A1* | 4/2012 | Taranta, II | G06F 11/1076 714/763 |
| 2012/0102260 A1 | 4/2012 | Kawamura et al. | |
| 2012/0265928 A1 | 10/2012 | Mun et al. | |
| 2013/0019051 A1* | 1/2013 | Somanache | G06F 12/0246 711/103 |
| 2013/0103889 A1* | 4/2013 | Jeong | G06F 12/0246 711/103 |
| 2013/0117632 A1 | 5/2013 | Fujinami et al. | |
| 2013/0151770 A1 | 6/2013 | Hara et al. | |
| 2013/0246721 A1 | 9/2013 | Fukutomi et al. | |
| 2014/0063956 A1* | 3/2014 | Lim | G11C 16/06 365/185.12 |
| 2014/0136927 A1* | 5/2014 | Li | G06F 11/1048 714/768 |

FOREIGN PATENT DOCUMENTS

| | | |
|---|---|---|
| JP | 2012-226822 A | 11/2012 |
| JP | 2013-101455 A | 5/2013 |
| JP | 2013-161447 A | 8/2013 |
| JP | 2013-532853 A | 8/2013 |
| WO | 2012/166726 A2 | 12/2012 |
| WO | 2013/084267 A1 | 6/2013 |

* cited by examiner

| LBA | Logical page number | Logical page size | Status | Block number | Page number | CW position | | | | | |
|---|---|---|---|---|---|---|---|---|---|---|---|
| | | | | | | 1 | 2 | 3 | 4 | 5 | n |
| 0 | 0 | 8KB | Valid | 0 | 0 | 1 | 1 | 1 | 0 | 0 | 0 |
| 16 | 1 | 8KB | Invalid | 0 | 0 | 0 | 1 | 1 | 1 | 1 | 0 |
| 32 | 2 | 8KB | Empty | N/A | N/A | 0 | 0 | 0 | 0 | 0 | 0 |
| ... | ... | ... | ... | ... | ... | ... | ... | ... | ... | ... | ... |
| n | n | 8KB | Empty | n | n | 0 | 0 | 0 | 0 | 0 | 0 |

Logical-physical conversion table 57

Fig.8

STORAGE APPARATUS AND DATA CONTROL METHOD OF STORING DATA WITH AN ERROR CORRECTION CODE

TECHNICAL FIELD

The present invention relates to a technique of reading and writing data in a storage apparatus.

BACKGROUND ART

A storage apparatus compatible with a small computer system interface (SCSI) exchanges data in units of data blocks of, for example, 512 bytes.

In recent years, there are storage apparatuses such as a solid state drive (SSD) that use a flash memory as a recording medium. With a NAND flash memory, data is read/written in units called "pages" of, for example, 8 kilobytes.

Data being held in a flash memory is by nature prone to error. Therefore an error correcting code (ECC) is added. A set of data stored in a flash memory and an ECC with respect to the data is referred to as code word (CW) (PTL 1 and PTL 2).

CITATION LIST

Patent Literature

[PTL 1]
U.S. Pat. No. 8,103,936
[PTL 2]
US2011/0320915

SUMMARY OF INVENTION

Technical Problem

In the case of reading data from a storage apparatus including a flash memory, it is necessary to execute an error correction process with respect to data using an ECC. Thus, the response performance of the storage apparatus improves when the number of executions of an error correction process is smaller, if possible.

An object of the present invention is to reduce the number of executions of an error correction process.

Solution to Problem

A storage apparatus according to one example of the present invention includes a storage medium including a plurality of pages as a unit of reading and writing data and a medium controller that controls read and write of data requested from a higher-level device to the storage medium. The storage medium includes a page buffer that stores data to be read or written in page units.

The medium controller generates a first data block including a data block received from the higher-level device, generates a second data block of a predetermined size including one or more undivided first data blocks, and generates and stores, in the page buffer of the storage medium, a third data block in which a correction code is added to the second data block.

The storage medium writes one or more of the third data blocks stored in the page buffer in a page, which is a write destination, out of the plurality of pages.

Advantageous Effects of Invention

With the present invention, the number of executions of an error correction process can be reduced. Accordingly, the response performance of a storage apparatus including a flash memory can be improved.

BRIEF DESCRIPTION OF DRAWINGS

FIG. 8 shows a configuration example of a logical-physical conversion table.

DESCRIPTION OF EMBODIMENTS

Hereinafter, examples of data read and write in a storage system including a flash memory as a recording medium will be shown with reference to the drawings.

Example 1

Figure 1:
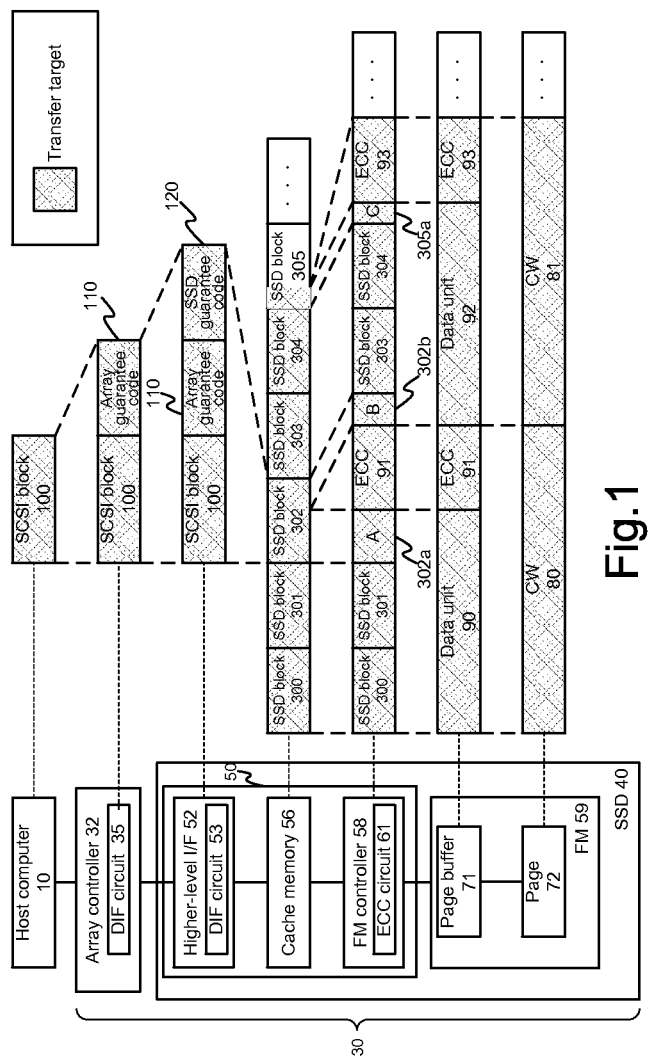
FIG. 1 shows an example of the correspondence relationship of the configuration of a storage system and the configuration of a data block in a comparative example.

FIG. 1 shows an example of the correspondence relationship of the configuration of a storage system and the configuration of a data block in a comparative example.

In this example, the storage system includes a host computer 10 and a storage apparatus 30. The storage apparatus 30 includes an array controller 32 and an SSD 40. The host computer 10, the array controller 32, and the SSD 40 exchange data according to the SCSI protocol. In the SCSI protocol, data is transferred in units of predetermined data blocks (hereinafter referred to as "SCSI blocks"). The size of one SCSI block is 512 bytes, for example. Hereinafter, a case where the host computer 10 transmits, as data for writing, a SCSI block 100 to the array controller 32 will be described.

The array controller 32 includes a data integrity field (DIF) circuit 35, for example. The DIF circuit 35 generates an array controller guarantee code (hereinafter referred to as "array guarantee code") 110 for guaranteeing consistency of data within the storage apparatus. The DIF circuit 35 adds the array guarantee code 110 to the SCSI block 100 transmitted from the host computer 10.

The SSD 40 includes a higher-level I/F 52 that is an interface for communication with a higher-level device, a cache memory 56 that temporarily stores data, an FM controller 58 that controls a flash memory (FM), and an FM 59. In this comparative example, the higher-level device for the SSD 40 is the array controller 32. In an environment in which the SSD 40 is coupled as an external storage device to the host computer 10, the higher-level device for the SSD 40 is the host computer 10.

The higher-level I/F 52 includes a DIF circuit 53, for example. The DIF circuit 53 generates an inside-SSD guarantee code (hereinafter referred to as "SSD guarantee code") 120 for guaranteeing consistency of data inside the SSD.

The FM controller 58 includes an ECC circuit 61, for example. The ECC circuit 61 adds an ECC to data to be stored in the FM.

The FM 59 includes a plurality of pages 72 and a page buffer 71 that temporarily stores data to be read/written with respect to the page 72. Specifically, for example, the FM 59 is a NAND FM including a plurality of blocks, and each block includes two or more pages 72. The FM 59 is an FM of a type in which overwriting is not possible. In the FM 59, data is read/written in page units, and data is erased in block units.

The array controller 32 transmits, with respect to the SSD 40, data in which the array guarantee code 110 is added to the SCSI block 100.

The DIF circuit 53 within the higher-level I/F 52 adds the SSD guarantee code 120 to the received data. As shown in FIG. 1, data including the SCSI block 100, the array guarantee code 110, and the SSD guarantee code 120 is referred to as SSD block 302. An SSD controller 50 manages data in units of SSD blocks.

Using the ECC circuit 61, the SSD controller 50 generates an ECC with respect to a plurality of SSD blocks. As shown in FIG. 1, a plurality of SSD blocks 300, 301, and so forth for which an ECC 91 is targeted is referred to as a data unit 90. The ECC is used in order to correct an error in the data unit. As shown in FIG. 1, data configured of the data unit 90 and the ECC 91 is referred to as a CW 80. In the page 72 of the FM 59, one or more of CWs 80, 81, and so forth are stored.

The size of the CW is determined by the necessary error correction capability. In the case where a high error correction capability is necessary, an ECC with a greater proportion with respect to the size of a data unit is added. The size of a CW and the proportion of ECC with respect to data unit are changeable.

In the comparative example, the size of the data unit 90 is not limited to a multiple of a size corresponding to one SSD block. For example, as shown in FIG. 1, the SSD block 302 is divided into and stored in the data unit 90 (block 302a) and a data unit 92 (block 302b) in the comparative example. That is, one SSD block 302 is divided into and stored in the CW 80 and the CW 81.

Hereinafter, with reference to FIG. 1, one example of a process in which the SCSI block 100 transmitted from the host computer 10 is written in the FM 59 of the storage apparatus 30 in the comparative example will be shown.

(1) The host computer 10 transmits a write request for the SCSI block 100 with respect to the array controller 32.

(2) With the array controller 32, using the DIF circuit 35, the SCSI block 100 is added with the array guarantee code 100[A1] and transferred to the higher-level I/F 52 including the SSD 40.

(3) With the higher-level I/F 52, using the DIF circuit 53, a data block transferred from the array controller 32 is further added with the SSD guarantee code 120 and stored in the cache memory 52[A2]. Hereinafter, a set of the SCSI block 100, the array guarantee code 110, and the SSD guarantee code 120 is the SSD block 302.

(4) The FM controller 58 extracts the data unit 90 of a predetermined length from the plurality of SSD blocks 300 to 302 stored in the cache memory 56, and generates the ECC 91 corresponding to the data unit 90 using the ECC circuit 61. With the FM controller 58, the CW 80 in which the ECC 91 is added to the data unit 90 is generated and stored in the page buffer 71 of the FM 59. In the case where the size of the data unit is not an integral multiple of the size of the SSD block, the SSD block 302 is divided into the blocks 302a and 302b to be respectively included in the different data units 90 and 92, as shown in FIG. 1, for example.

(5) The FM 59 extracts a CW corresponding to one page from the page buffer 71 and writes the extracted one or more CWs together in the page 72.

In this manner, one SSD block 302 may be stored across two CWs 80 and 81.

Hereinafter, one example of a process in which the host computer 10 reads the SCSI block 100 from the storage apparatus 30 in the comparative example will be shown with reference to FIG. 1.

(1) The host computer 10 transmits a read request for the SCSI block 100 with respect to the array controller 32.

(2) The array controller 32 indicates data transfer with respect to the SSD controller 50 of the SSD 40 in which the SCSI block 100 is stored. In FIG. 1, the SCSI block 100 is included in the SSD block 302. The SSD block 302 is divided into and stored in the CW 80 and the CW 81.

(3) With the SSD controller 50, data stored in the page 72 is read collectively and stored in the page buffer 71. This is because the FM 59 needs to read (and write) data in page units.

(4) Since the SCSI block 100 is divided into the CW 80 and the CW 81, the SSD controller 50 acquires data of the CW 80 and the CW 81 from the data in page units stored in the page buffer 71. Such a method of acquiring, from data stored in the page buffer 71 in page units, a CW that is a portion thereof may be hereinafter referred to as "partial read."

(5) Using the ECC circuit 61, the SSD controller 50 extracts, from the CW 80, the data unit 90 for which error has been corrected with the ECC 91. In a similar manner, using the ECC circuit 61, the SSD controller 50 extracts, from the CW 81, the data unit 92 for which error has been corrected with an ECC 93. The SSD controller 50 stores the extracted data unit 90 and data unit 91[A3] in the cache memory 56.

(6) The SSD controller 50 merges the block 302a included in the data unit 90 and the block 302b included in the data unit 92 to generate the SSD block 302.

(7) The SSD controller 50 transfers data of the generated SSD block 302 to the higher-level I/F 52.

(8) With the DIF circuit 53 of the higher-level I/F 52, consistency of a set of the SCSI block 100 and the array guarantee code 110 is checked using the SSD guarantee code 120, and, in the case where there is not a problem, the set of the SCSI block 100 and the array guarantee code 110 is transferred to the array controller 32.

In the case where the SSD block 302 divided into two CWs 80 and 81 is transferred to the array controller 32 in the comparative example in this manner, the SSD controller 50 needs to read the two CWs 80 and 81 into the cache memory 56. Thus, data transfer corresponding to the two CWs 80 and 81 occurs between the page buffer 71, the FM controller 58, and the cache memory 56. The FM controller 58 needs to execute error correction corresponding to the two CWs using the ECC circuit 61. That is, in the case where an SSD block that is across two CWs is read in the comparative example, the number of error correction processes by the ECC circuit 61 and the bandwidth of data transfer from the page buffer 71 to the cache memory 56 are both twice compared to a case where an SSD block included in one CW is read. This also leads to a decrease in response speed of the SSD 40. Thus, the storage system according to this example is configured such that an SSD block is not stored across two CWs, as shown below.

Figure 2:
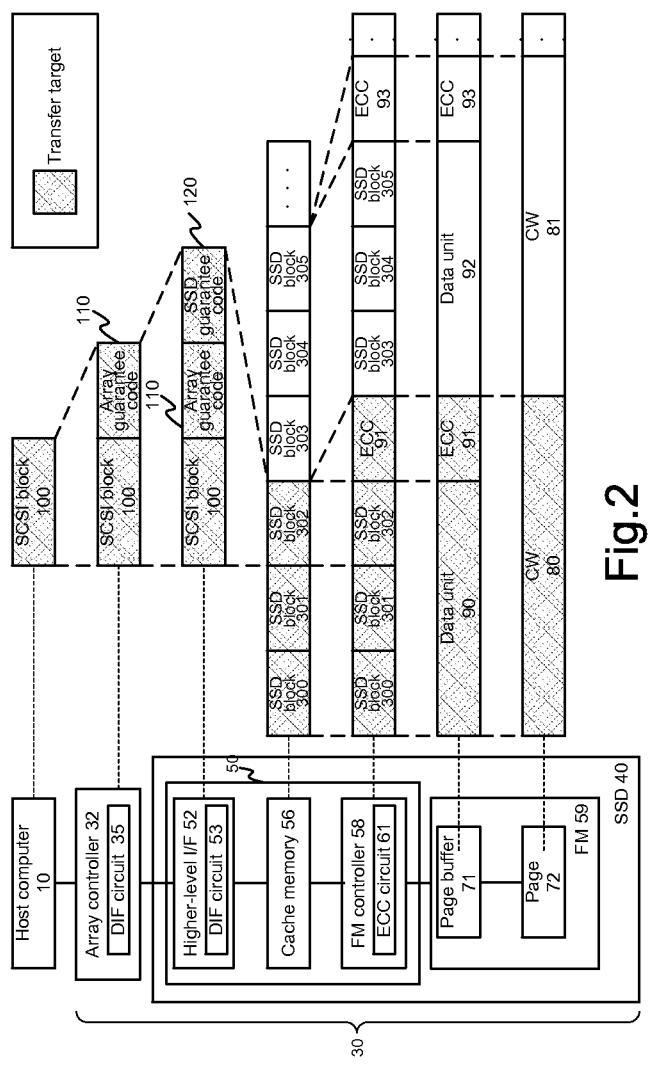
FIG. 2 shows an example of the correspondence relationship of the configuration of a storage system and the configuration of a data block according to a first example.

FIG. 2 shows an example of the correspondence relationship of the configuration of a storage system and the configuration of a data block according to a first example.

In this example, a data unit of a CW is configured to include one or more SSD blocks and not include data that is only a part of an SSD block. This is to realize a data storage format optimal for the partial read described above. For example, the size of a data unit of a CW is a multiple of (N times (where N is an integer)) the size of an SSD block.

For example, as shown in FIG. 2, the data unit 90 of one CW 80 is configured of three SSD blocks 300, 301, and 302.

In process (4) described above in this case, the SSD controller 50 reads data of a portion for the CW 80 from data in page units stored in the page buffer 71. It suffices that the SSD controller 50 executes processes (5) and thereafter described above with respect to only the read CW 80.

That is, in this example shown in FIG. 2, data transfer of only one CW 80 between the page buffer 71, the FM controller 58, and the cache memory 56 suffices upon reading the SSD block 302, in contrast to the example shown in FIG. 1. In the ECC circuit 61 of the FM controller 58, it suffices to execute an error correction process for only one CW 80. Thus, in this example shown in FIG. 2, a decrease in response speed of the SSD 40 does not occur, in contrast to the example shown in FIG. 1. In FIG. 2, the size of the data unit 90 of the CW 80 is three times the size of the SSD block. However, the size of the data unit 90 of the CW 80 and the size of the SSD block may be the same.

In this example, the size of data read from the FM 59 and the minimum data transfer size specified by the SCSI protocol can be made equal. Accordingly, the response speed of the SSD with respect to a read request for data smaller than the page size can be increased.

In writing of data into the page 72, in to FIG. 2, the data unit 90 in the CW 80 to be written in the page 72 by the SSD controller 50 is configured of only N (where N is a positive integer) SSD blocks (e.g., three SSD blocks 300 to 302) according to the data storage format. As long as one SSD block is not across two data units, it is not necessary that the size of the data unit 90 be a multiple of the SSD block. For example, if consecutive N plus one SSD blocks do not fit in the data unit 90 within a first CW, the SSD controller 50 may assume the last SSD block of the consecutive N plus one SSD blocks to be the leading SSD block of the data unit 92 in a second CW (CW following the first CW) and pad the data unit 90 in the first CW, so that the data unit 90 within the first CW is configured of N consecutive SSD blocks and padded data.

Figure 3:
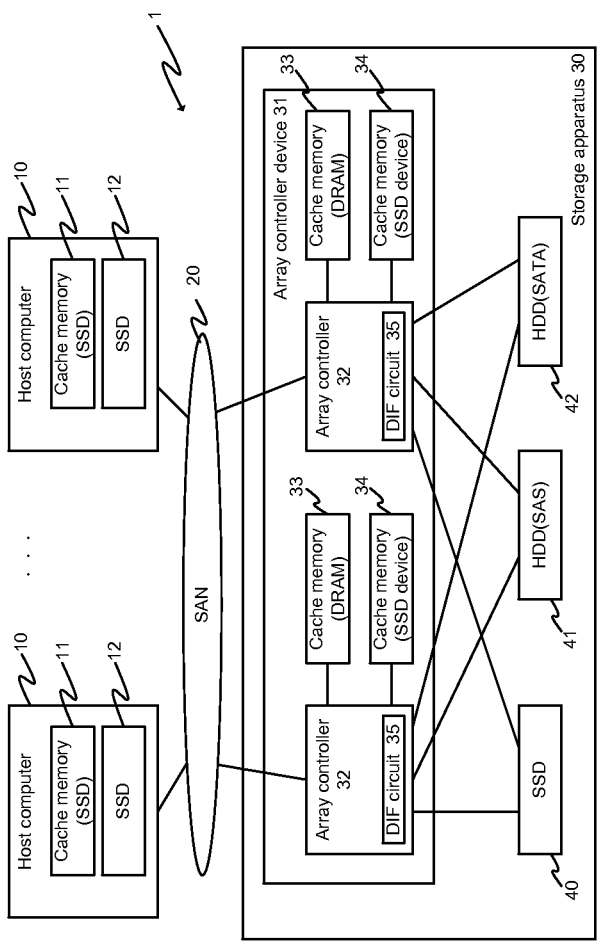
FIG. 3 is a block diagram showing a configuration example of the storage system.

FIG. 3 is a block diagram showing a configuration example of the storage system.

A storage system 1 includes the storage apparatus 30 and the host computer 10.

The host computer 10 is one example of a higher-level device that utilizes the storage apparatus 30. The host computer 10 is an application server, for example. The host computer 10 and the storage apparatus 30 communicate via a storage area network (SAN) 20, for example. The SAN 20 may use, for example, fibre channel, SCSI, Internet SCSI (iSCSI), universal serial bus (USB), IEEE 1394 bus, and/or serial attached SCSI (SAS). A communication network of other types (e.g., local area network (LAN)) may be used instead of the SAN 20. The storage system 1 may include a plurality of host computers 10 and/or a plurality of storage apparatuses 30.

The storage apparatus 30 includes an array controller device 31 and a plurality of storage devices. The storage device is the SSD 40, a SAS-compatible HDD 41, or a SATA-compatible HDD 42, for example.

The array controller device 31 includes the array controller 32 that controls the storage apparatus 30 and cache memories 33 and 34 that temporarily store data. The array controller device 31 may include one or more cache memories. The cache memory may be configured of a dynamic random access memory (DRAM) and/or SSD or the like.

The array controller 32 may include the DIF circuit 35 that performs generation, addition, checking, deletion, or the like of an array guarantee code.

The host computer 10, the array controller 32, and the SSD controller 50 (see FIG. 4) may perform definition of a logical address space and transfer of data using a communication protocol such as SCSI, SATA, ATA, or NVM Express.

Figure 4:
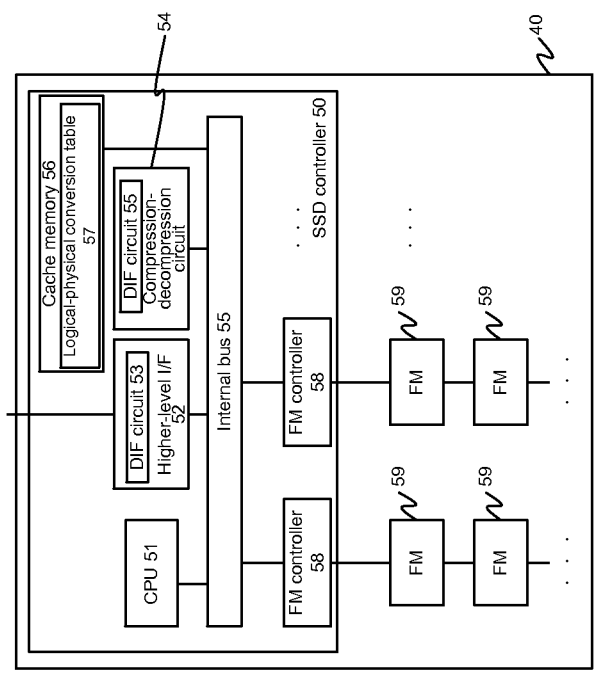
FIG. 4 is a block diagram showing a configuration example of an SSD 40.

FIG. 4 is a block diagram showing a configuration example of the SSD 40.

The SSD 40 includes a plurality of the FMs 59 and the SSD controller 50 coupled thereto.

The SSD controller 50 controls operation of the SSD 40. The SSD controller 50 includes a CPU 51, the higher-level I/F 52 that is an interface for communication with a higher-level device, a compression-decompression circuit 54 that compresses and decompresses data inside the SSD, the cache memory 56 that temporarily stores data, and the FM controller 58 that controls the FM 59. The components 51, 52, 54, and 58 are coupled by an internal bus 55[A4] capable of a two-way data communication.

The higher-level I/F 52 may include the DIF circuit 53 that performs generation, addition, checking, and deletion of an SSD guarantee code. The compression-decompression circuit 54 may include a DIF circuit 55 that checks the consistency of compressed data. The cache memory 56 may store a logical-physical conversion table 57 that manages the correspondence relationship of a logical address space and a physical address space within the SSD 40.

The FM 59 is, for example, a NAND FM but may be a NOR FM. Instead of the FM 59, various semiconductor memories such as a magnetoresistive random access memory (MRAM) that is a magnetoresistive memory, a resistance random access memory (ReRAM) that is a resistive memory, or a ferroelectric random access memory (FeRAM) that is a ferroelectric memory may be used.

Figure 5:
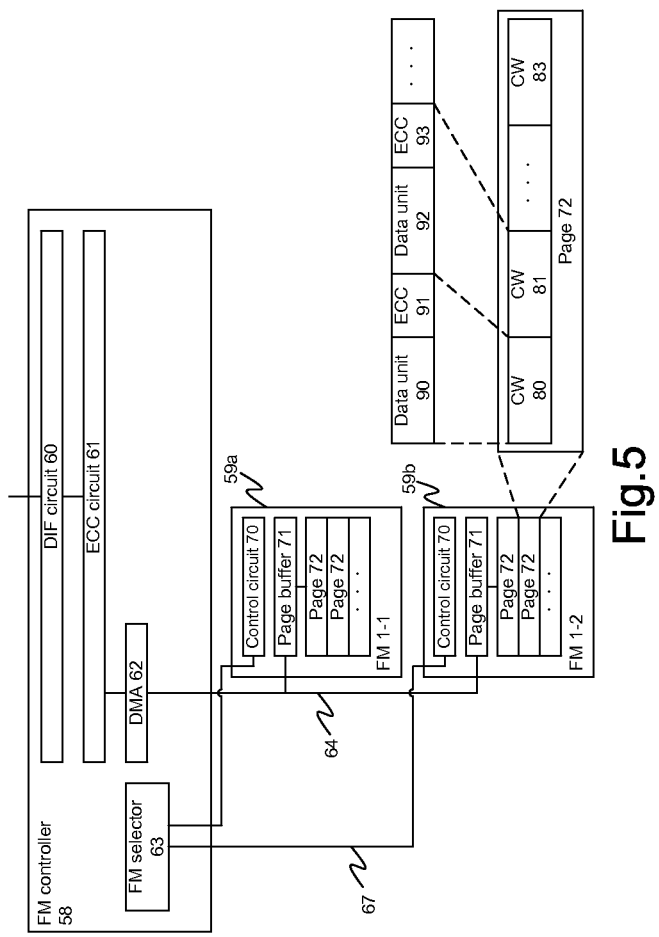
FIG. 5 is a block diagram showing a configuration example of an FM controller and a flash memory.

FIG. 5 is a block diagram showing a configuration example of the FM controller 58 and the FM 59. In the case of illustrating a plurality of components of the same type with distinction, different subordinate signs (a, b, and so forth) are added to a reference sign (e.g., 59) for the plurality of components of the same type, as shown in FIG. 5.

The FM controller 58 controls data transferred between the FM 59 and the cache memory 56. The FM controller 58 may include a DIF circuit 60 and the ECC circuit 61. The DIF circuit 60 checks the consistency of data using an SSD guarantee code. The ECC circuit 61 performs generation, addition, deletion, error correction, and the like of ECC with respect to data stored in the FM 59. The FM controller 58 includes a DMA 62 that executes DMA transfer of data, an FM selector 63 that selects the FM 59 of a data transfer target, and a protocol circuit 65 that generates a command with respect to the FM 59.

FMs 59a and 59b each include therein a control circuit 70 for controlling the FM, the page buffer 71 that temporarily stores data, and a plurality of the pages 72.

In the page 72, data configured of one or more CWs is stored in page units. In FIG. 5, the CW 80 includes the data unit 90 and the ECC 91, and the CW 81 includes the data unit 92 and an ECC 93.

The FM selector 63 and the control circuit 70 of each FM are coupled by an independent FM bus 67. The DMA 62 and each page buffer 71 are coupled by one shared FM bus 64. Thus, the FM controller 58 can communicate with only one FM 59 at a certain time point.

Hereinafter, a process of a case where the FM controller 58 reads data from the FM 59b will be described. The FM controller 58 sends a select signal to the control circuit 70 of the FM 59b through the FM selector 63. The FM 59b that has received the select signal interprets a command sent thereafter as valid for itself.

Next, the FM controller 58 transmits a read command to the FM 59b through the FM bus 64. The FM 59b that has received the read command transfers entire data of the page 72 to the page buffer 71, for example. Since the read command is transmitted to both the FM 59a and the FM 59b while the select signal is not transmitted to the FM 59a at this time, only the FM 59b executes an operation with respect to the received command.

A process of data transfer from the page 72 to the page buffer 71 is generally called a chip busy process. For the chip busy process, time is required to a certain degree. The FM controller 58 transmits a signal that invalidates a select state with respect to the FM 59b while the FM 59b is in the chip busy process, for example. This is to allow the FM controller 58 to communicate with the different FM 59a concurrently while the FM 59b is in the chip busy process, for example. That is, this is to allow the FM controller 58 to operate a plurality of FMs in parallel.

After termination of the chip busy process in the FM 59b, the FM controller 58 transmits a select signal to the FM 59b. The FM controller 58 transmits, to the FM 59b, a command for transferring data within the page buffer 71 to the ECC circuit. For example, with respect to the FM 59b, the FM controller 58 first transmits a command designating a data transfer start position (offset) within the page buffer 71, and subsequently transmits a command indicating data transfer. With the FM 59b that has received the command for data transfer indication, predetermined data is read from the designated offset position into the page buffer 71 and transmitted to the FM controller 58 through the FM bus 64.

The FM controller 58 can determine the length of data to be read from the page buffer 71 by determining the number of issuances of a data transfer indication. For example, in the case where the bus width of the FM bus 64 is 1 byte, it suffices that the FM controller 58 issue a data transfer indication 512 times in order to transfer data corresponding to 512 bytes.

For example, in the case where only data of a CW stored at the beginning of a page is read, it suffices that the FM controller 58 designate the offset as the beginning (zero) and issue a data transfer indication corresponding to the size of CW with respect to an FM 592[A5].

For example, in the case of reading data in page units, it suffices that the FM controller 58 read data of all CWs within the page buffer 71. That is, it suffices that the FM controller 58 issue a data transfer indication corresponding to the size of a page with respect to the FM 59b. After termination of data transfer from the page buffer 71, the FM controller 58 transmits a signal that invalidates a select state with respect to the FM 59b.

For data transferred to the ECC circuit 61, error correction with an ECC is executed in CW units. Then, the ECC is deleted, and a transfer is made to the DIF circuit 60. In the DIF circuit 60, consistency of data is checked with an SSD guarantee code. Data that has passed through the check is transferred to the cache memory 56.

Figure 6:
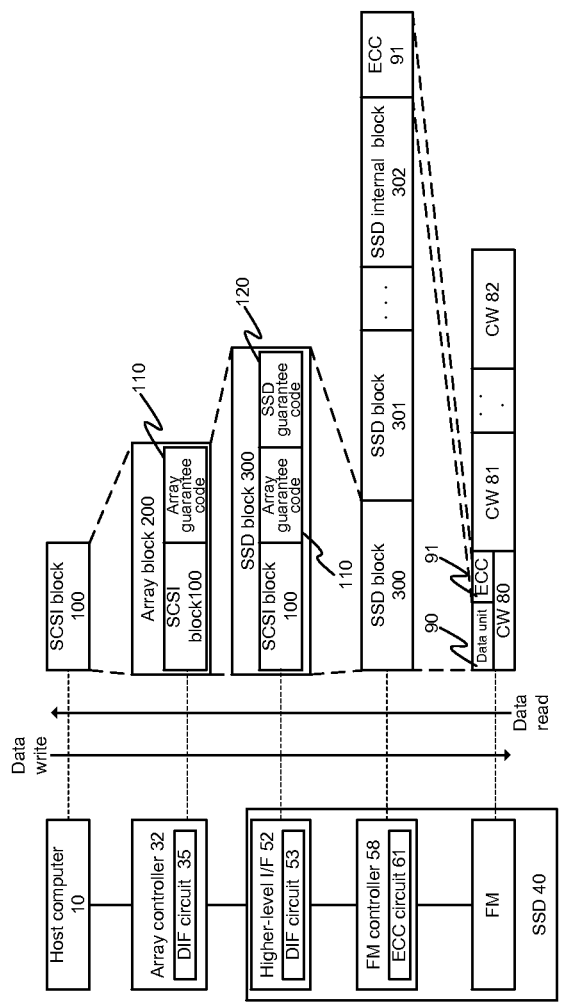
FIG. 6 shows an example of the configuration of a data block including a guarantee code.

FIG. 6 shows an example of the configuration of a data block including a guarantee code.

The array controller 32 adds the array guarantee code 110 to the SCSI block 100 received from the host computer 10 to generate an array block 200. The array guarantee code 110 is configured, for example, from a cyclic redundancy check (CRC) for detecting an error in the SCSI block 100, address information for detecting an error in an address at the time of direct memory access (DMA) transfer, and the like. At the time of data read, the array controller 32 recalculates the CRC for comparison with an expected value to detect an error in data. The array controller 32 compares the address information and the expected value to check whether or not data of a correct address is transferred. Accordingly, the array controller 32 prevents erroneous data from being provided with respect to a read request of the host computer 10.

Next, the array controller 32 transmits the array block 200 to the SSD controller 50. The SSD controller 50 adds the SSD guarantee code 120 to the array block 200 to generate an SSD block 300. By adding the SSD guarantee code 120, the SSD controller 50 prevents erroneous data from being provided with respect to a read request of the array controller 32.

The FM controller 58 adds one ECC 91 with respect to one or more SSD blocks 300 to generate the CW 80. The FM controller 58 stores the CW 80 in the FM 59. The number of SSD blocks stored in one CW can be determined arbitrarily in accordance with a target data failure rate or the like intended for an SSD. By adding the ECC 91, the FM controller 58 can correct an error read from the FM.

Figure 7:
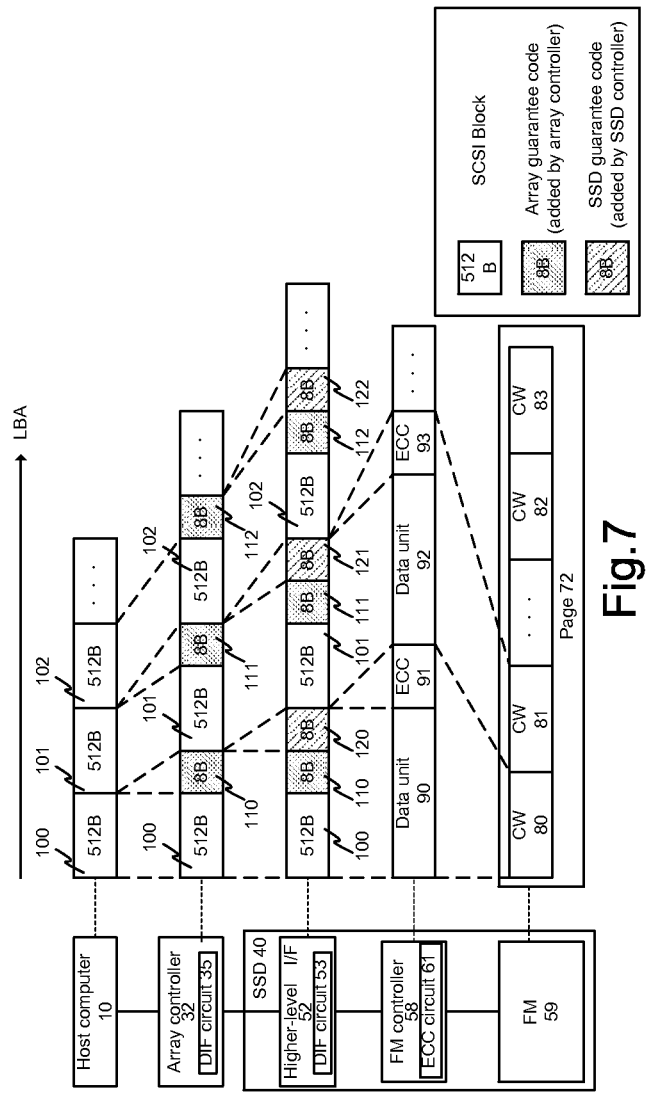
FIG. 7 shows the relationship of an LBA space provided to a host computer and the configuration of a data block.

FIG. 7 shows the relationship of an LBA space provided to the host computer 10 and the configuration of a data block.

As described above, each device within the storage system performs data communication according to the SCSI protocol. Therefore, the host computer 10 recognizes a logical address space provided by the array controller 32 to be in a size of "512 bytes times N (where N is a positive integer)." Data transfer between the host computer 10 and the array controller 32 is executed in units of 512 bytes that is the size of a SCSI block.

Next, the array controller 32 adds the array guarantee code 110 of 8 bytes to one SCSI block 100, for example. That is, the size of one array block is 520 bytes. The array controller 32 recognizes a logical address space provided by the SSD controller 50 to be in a size of "520 bytes times N (where N is a positive integer)."

The SSD controller 50 adds the SSD guarantee code 120 of 8 bytes to one array block, for example. That is, the size of one SSD block is 528 bytes.

In FIG. 7, the size of a data unit of a CW is 528 bytes in which 8 bytes of an array guarantee code and 8 bytes of an SSD guarantee code are added to 512 bytes of a SCSI block. The size of the CW is a size of the data unit added with an arbitrary ECC. The size of the page 72 is of N CWs (where N is a positive integer), for example.

FIG. 8 shows a configuration example of the logical-physical conversion table 57.

The logical-physical conversion table 57 includes, as data items, an LBA 570, a logical page number 571, a logical page size 572, a status 573, a block number 574, a page number 575, and a CW position 576.

The LBA 570 is a value showing the start position of an LBA provided to the array controller 32. The LBA 570 is managed as a logical page having a specific size. The logical page number 571 is a value with which a logical page is uniquely identified. The logical page size 572 is a value showing the size of a logical page.

The status 573 is a value showing one of "valid," "invalid," and "empty" for each logical page. In an SSD that is a recordable device, an "empty" area for storing write data needs to be ensured by a reclamation process. The status 573 is used for controlling the reclamation process.

The reclamation process is a process in which data stored in a certain page is copied to another page. In an SSD, data needs to be erased in units of blocks configured from a plurality of pages. Therefore, valid data needs to be copied to another page before data within a block is entirely erased. In such cases, the reclamation process is executed.

The block number 574, the page number 575, and the CW position 576 are respectively values showing a block, page, and the position of CW in which a logical page is stored.

Figure 9:
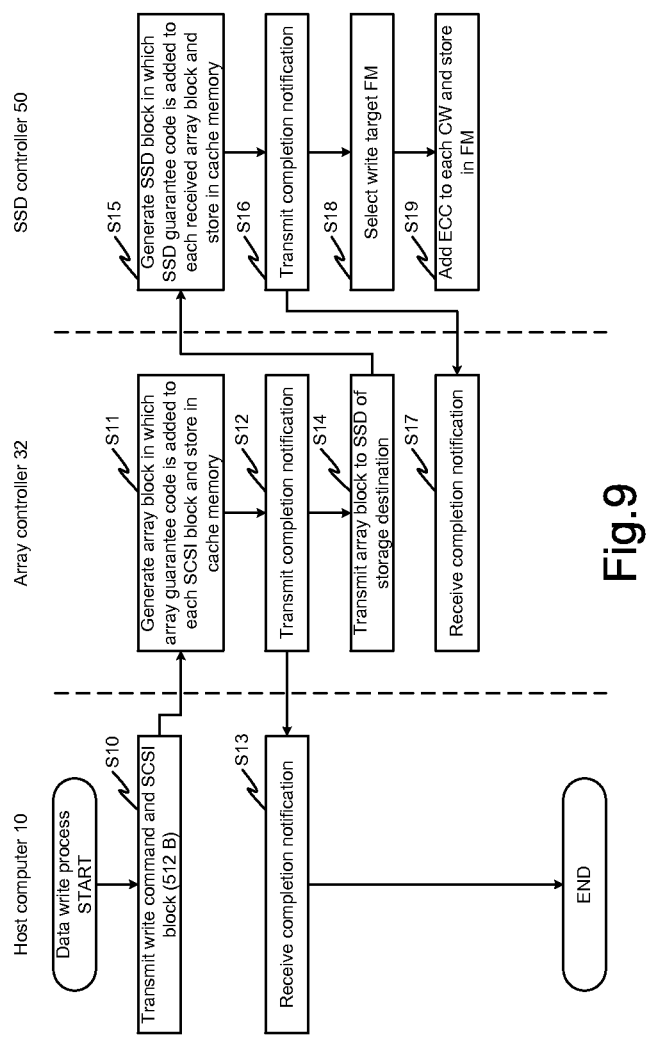
FIG. 9 is a sequence diagram showing one example of a data write process in the storage system.

FIG. 9 is a sequence diagram showing one example of a data write process in the storage system.

The host computer 10 transmits a write command and data for writing with respect to the array controller 32 (S10).

With the array controller 32, each SCSI block (512 bytes) is added with an array guarantee code (8 bytes) to generate an array block (520 bytes) and stored in the cache memory 33 (S11).

With respect to the host computer 10, the array controller 32 transmits a completion notification of a process (S12). The array controller 32 transmits a storage destination of an array block to the SSD (S14).

The host computer 10 that has received the completion notification from the array controller 32 terminates a series of processes (S13).

With the SSD controller 50, an SSD block (528 bytes) in which an SSD guarantee code (8 bytes) is added to each array block (520 bytes) received from the array controller 32 is generated and stored in the cache memory 56 (S15).

With respect to the array controller 32, the SSD controller 50 transmits a completion notification of a process (S16). The SSD controller 50 refers to the logical-physical conversion table 57 and selects an FM of a write target (S18). With the SSD controller 50, each CW is added with an ECC and stored in the FM (S19).

The array controller 32 that has received the completion notification of the process from the SSD controller 50 terminates a series of processes (S17).

By the process described above, the data for writing transmitted from the host computer 10 is stored in the FM.

Figure 10:
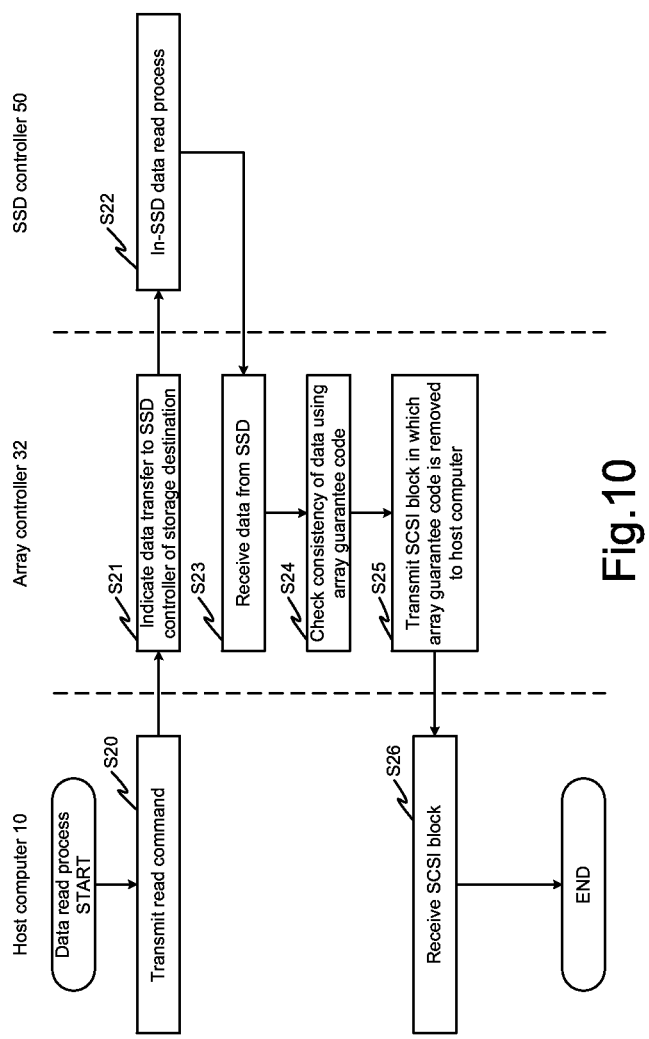
FIG. 10 is a sequence diagram showing one example of a data read process in the storage system.

FIG. 10 is a sequence diagram showing one example of a data read process in the storage system.

With respect to the array controller 32, the host computer 10 transmits a read command for data (S20).

The array controller 32 interprets the read command and transmits a data transfer indication with respect to the SSD controller 50 of a data storage destination (S21).

The SSD controller 50 that has received the data transfer indication from the array controller 32 reads data from an FM. The SSD controller 50 transmits the read data to the array controller 32 (S22). A process in S22 will be described in detail with FIG. 11.

The array controller 32 receives the data from the SSD controller 50 (S23). The array controller 32 checks the consistency of the data using an array guarantee code (S24). The array controller 32 transmits a SCSI block in which the array guarantee code is removed to the host computer 10 (S25). The host computer 10 receives the SCSI block from the array controller 32 and terminates the process (S26).

Figure 11:
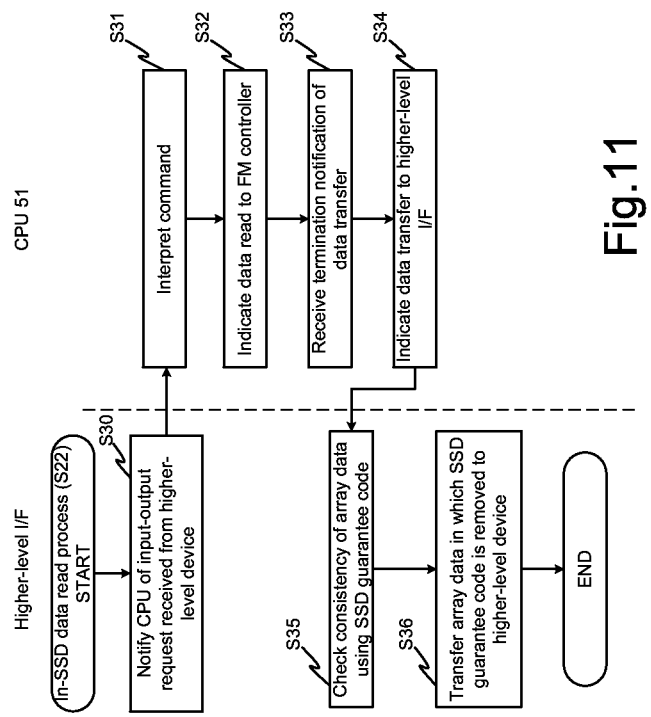
FIG. 11 is an example of a flowchart showing the details of an in-SSD data read process (S22) in an SSD controller.

FIG. 11 is an example of a flowchart showing the details of an in-SSD data read process (S22) in the SSD controller 50.

The higher-level I/F 52 notifies an I/O request (read request herein) received from the array controller 32 that is a higher-level device to the CPU 51 (S30).

The CPU 51 interprets that a corresponding command is the read request (S31). With respect to the FM controller 58, the CPU 51 issues an indication that a CW including data showing the read request is to be transferred to the cache memory 56 (S32). A process in S32 will be described in detail with FIG. 12.

From the FM controller 58, the CPU 51 receives a termination notification of data transfer (S33). With respect to the higher-level I/F 52, the CPU 51 indicates that data within the cache memory 56 is to be transferred to the array controller 32 (S34).

The higher-level I/F 52 that has received a data transfer indication checks the consistency of an array block using an SSD guarantee code (S35). The higher-level I/F 52 transfers array data in which the SSD guarantee code is removed to the array controller 32 that is the higher-level device (S36) and terminates the process (END).

Figure 12:
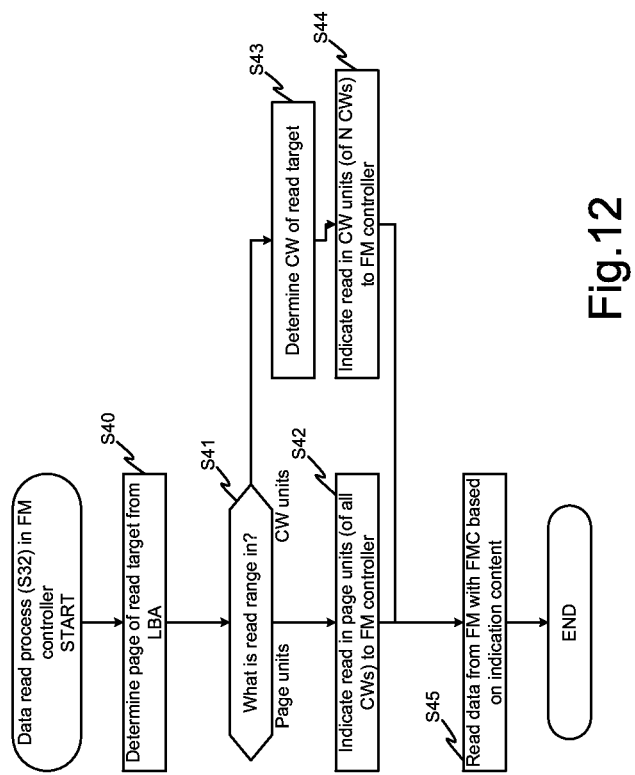
FIG. 12 is an example of a flowchart showing the details of a data read process (S32) in the FM controller.

FIG. 12 is an example of a flowchart showing the details of a data read process (S32) in the FM controller.

The CPU 51 identifies an FM and page in which data of a read target is stored from the logical-physical conversion table 57 with an LBA included in the read command as a key (S40).

The CPU 51 determines whether a read range is to be in "page units" or "CW units" (S41).

In the case where the size of the read request is equal to the size of the page, the CPU 51 determines the read range to be in "page units" (S41: page units). The CPU 51 indicates a read in page units (of all CWs) to the FM controller 58 (S42). A read in page units refers to a read of all CWs stored in a page. In the case where a read indication in page units has been received, the FM controller 58 reads all CWs from the FM (S45) and terminates the process (END). A process in S45 will be described in detail with FIG. 13.

In the case where the size of the read request is smaller than the size of the page, the CPU 51 determines the read range to be in "CW units" (S41: CW units). The CPU 51 refers to the logical-physical conversion table 57 and determines a CW of the read target (S43). The CPU 51 indicates a read in CW units (e.g., read of N CWs) to the FM controller 58 (S44). In the case where a read indication in CW units has been received from the CPU 51, the FM controller 58 reads the designated CW from the FM (S45) and terminates the process (END).

Figure 13:
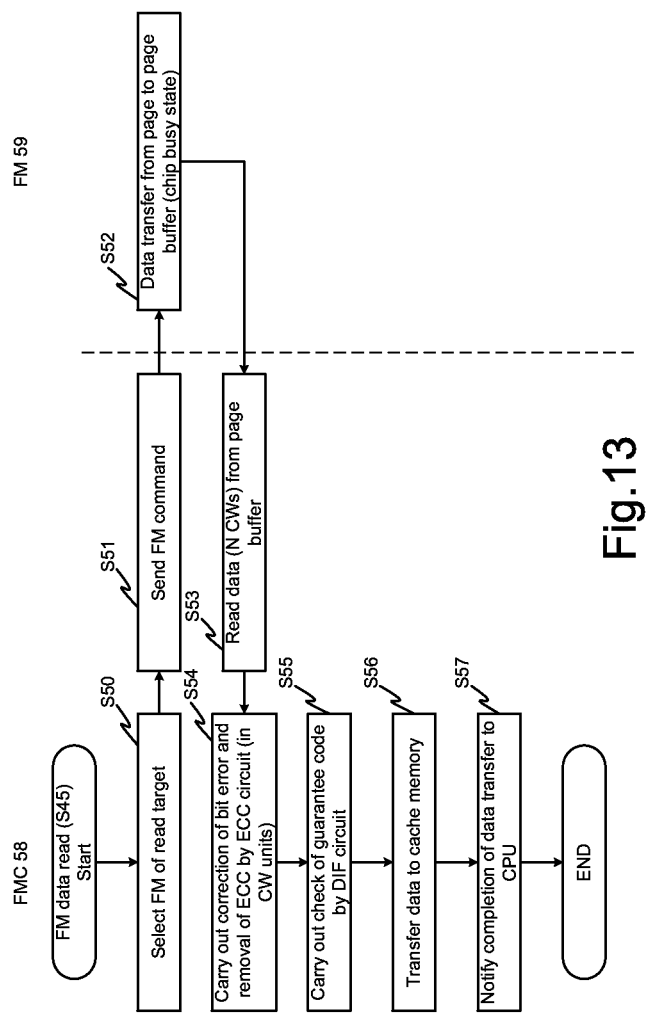
FIG. 13 is a flowchart showing the details of a process (S45) in which the FM controller reads data from an FM.

FIG. 13 is an example of a flowchart showing the details of the process (S45) in which the FM controller reads data from the FM.

The FM controller 58 interprets the indication from the CPU 51 and selects the FM of a read target (hereinafter referred to as "target FM") (S50). That is, a select signal is transmitted with respect to the target FM 59.

With respect to the target FM 59, the FM controller 58 transmits a command for data transfer from the page 72 to the page buffer 71 (S51). The FM 59 that has received the command transitions to a state of the chip busy process. After predetermined time has elapsed, the FM 59 transmits a termination notification of the chip busy process to the FM controller 58 (S52).

The FM controller 58 acquires a necessary number of CWs from the page buffer 71 (S53). The ECC circuit 61 in the FM controller 58 extracts, from the acquired CW, a data unit in which error correction has been performed using an ECC (S54).

The DIF circuit 60 in the FM controller 58 checks the consistency of an SSD block using an SSD guarantee code (S55).

The FM controller 58 transfers the SSD block to the cache memory 56 (S56). The FM controller 58 transmits a completion notification of a process to the CPU 51 (S57) and terminates the process.

Figure 14:
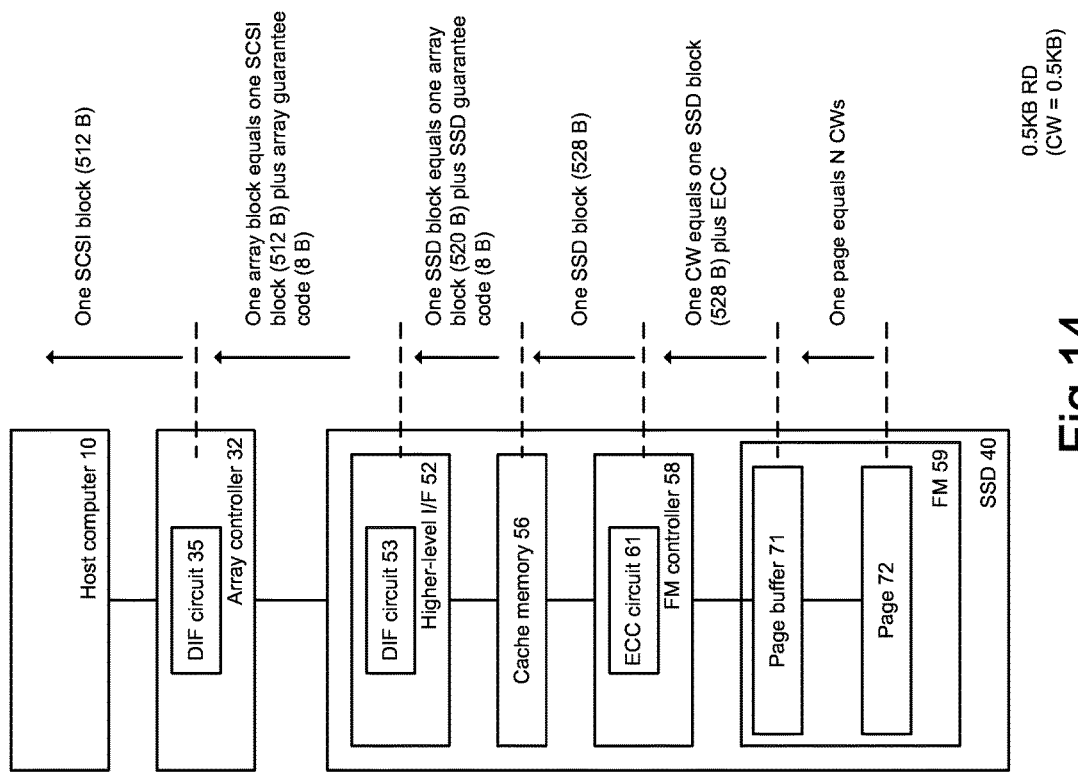
FIG. 14 shows one example of the relationship of a component of the storage system and the size of transfer data.

FIG. 14 shows one example of the relationship of a component of the storage system and the size of transfer data.

FIG. 14 is an example of a case where there has been a data read request for one SCSI block (512 bytes) from the host computer 10, one ECC is added to one SSD block (528 bytes) in the SSD 40, and the size of one CW is "528 bytes plus the size of ECC."

First, data for one page is transferred from the page 72 to the page buffer 71. One page is configured of N CWs (where N is a positive integer), for example.

Next, one CW is transferred from the page buffer 71 to the ECC circuit 61. One CW is configured of one SSD block (528 bytes) plus an ECC (of a predetermined size), for example.

The ECC is removed by the ECC circuit 61, and one SSD block (528 bytes) is transferred from the ECC circuit 61 to the cache memory 56.

Next, the SSD block (528 bytes) is transferred from the cache memory 56 to the higher-level I/F 52. An SSD guarantee code (8 bytes) is removed by the DIF circuit 53 of the higher-level I/F 52, and an array block (520 bytes) is transferred from the higher-level I/F 52 to the array controller 32.

Next, an array guarantee code (8 bytes) is removed by the DIF circuit 35 of the array controller 32, and a SCSI block (512 bytes) is transferred from the array controller 32 to the host computer 10.

As described above, a storage format in which one SSD block is not divided into two CWs between the page buffer 71 and the cache memory 56 has been shown in the first example. Accordingly, occurrence of excess data transfers can be prevented. Thus, a decrease in response speed of an SSD can be prevented.

A method described above may be another method that can transfer, from an FM, data of an arbitrary size designated by an FM controller. A page storage format may be changed as in FIG. 15 below, for example, in accordance with the coupling configuration or the like of an SSD.

Figure 15:
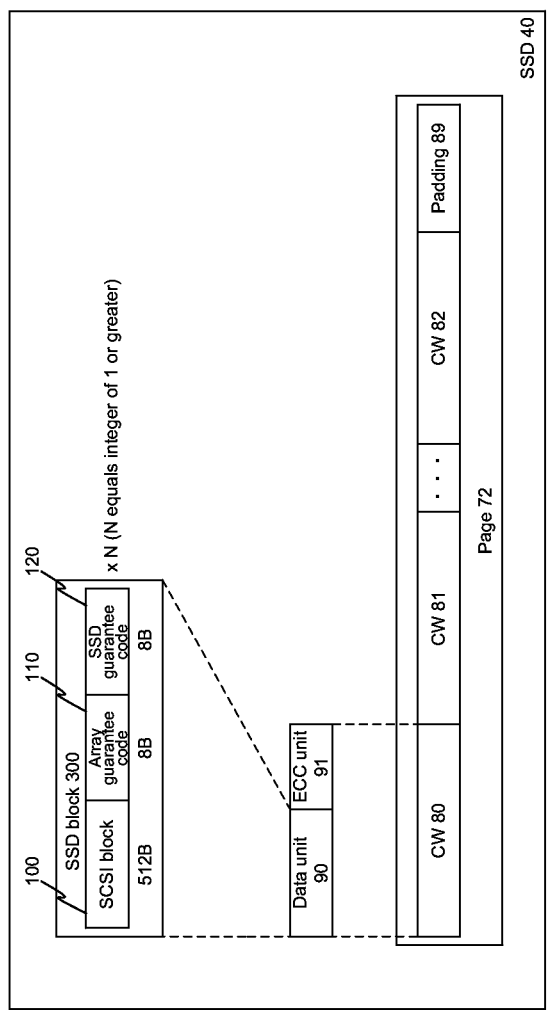
FIG. 15 shows a modified example of a data storage format of the FM.

FIG. 15 shows a modified example of the data storage format of an FM.

In page 72, data is stored in CW units. However, a multiple of the size of a CW may not necessarily match the size of a page. In this case, a fractional portion may be padded with padding data 89 such as "0" or "NULL" up to the size of the page 72.

In the data unit 90 of a CW, one or more SSD blocks 300 may be stored. The SSD block 300 may be configured of a SCSI block, an array guarantee code, and an SSD guarantee code. The array controller 32 may not add an array guarantee code. The SSD controller 50 may not add an SSD guarantee code.

In the case where only one of the array controller 32 and the SSD controller 50 adds a guarantee code, it suffices to replace the size of one SSD block 300 with "520 bytes" in the description above. In the case where neither the array controller 32 nor the SSD controller 50 adds a guarantee code, it suffices to replace the size of one SSD block 300 with "512 bytes" in the description above.

In the description above, the size of a guarantee code may be a value other than "8 bytes." In that case, it suffices to replace the size of the SSD block 300 and the size of the data unit 90 of the CW in this example in accordance with the size of the guarantee code.

The size of the SCSI block 100 may be a value other than "512 bytes." The size of the SCSI block 100 may be changed in accordance with an arbitrary size greater than or equal to a minimum data transfer size specified in the communication protocol.

Even in the case where the SSD 40 is directly coupled to the host computer 10, a change may be made in accordance with the size of the SSD block 300 and the size of the data unit 90 of the CW, depending on the communication protocol or the presence or absence of a guarantee code.

Example 2

In a second example, a case where the SSD 40 performs compression of data inside will be described.

Figure 16:
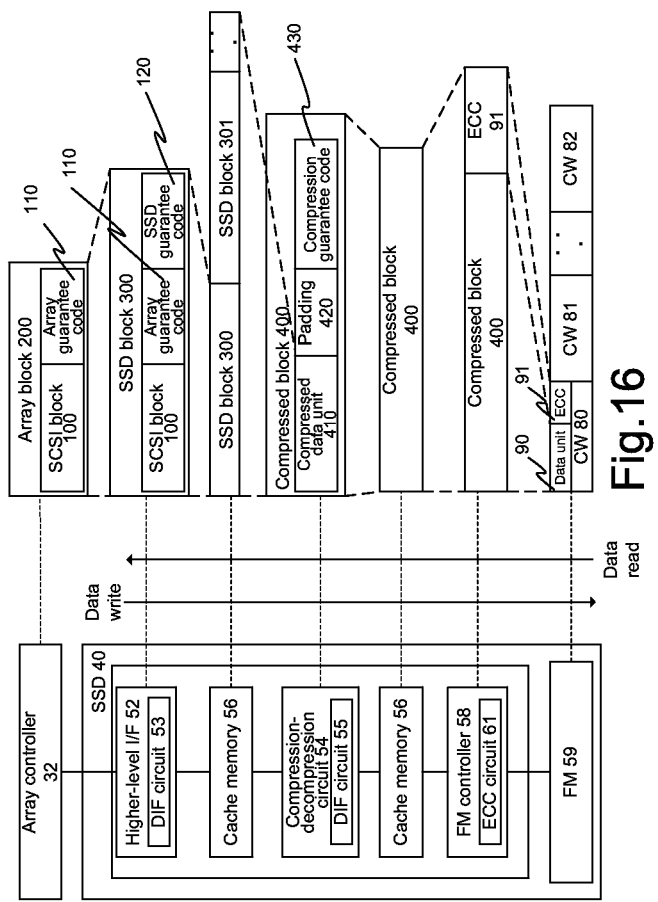
FIG. 16 shows an example of the correspondence relationship of the configuration of a storage system and the configuration of a data block according to a second example.

FIG. 16 shows an example of the correspondence relationship of the configuration of a storage system and the configuration of a data block according to the second example.

In comparison with the first example, the second example differs in that the SSD 40 includes the compression-decompression circuit 54 that performs compression and decompression of data. Thus, in comparison with the first example, the second example differs in sequence of transferring an SSD block between the cache memory 56 and the FM 59. Since data transfer between the host computer 10 and the array controller 32 is the same as in the first example, description is omitted herein.

Hereinafter, one example of a process in which the storage system according to the second example writes data will be described.

1) The SSD controller 50 adds the SSD guarantee code 120 to the array block 200 generated by the array controller 32 and generates the SSD block 300. The SSD controller 50 stores the SSD block 300 in the cache memory 56.

2) The SSD controller 50 compresses N SSD blocks stored in the cache memory 56 using the compression-decompression circuit 54. Data thus compressed is referred to as compressed data unit 410.

3) The compression-decompression circuit 54 adds padding data 420 and a compressed data unit guarantee code (hereinafter referred to as "compression guarantee code") 430 to the compressed data unit 410 to generate a compressed block 400. The reason for adding the padding data 420 is as follows. The size of the compressed data unit 410 may change depending on the compression rate of data. The compression guarantee code 430 is normally in a fixed size. Thus, there may be cases where the total of sizes of the compressed data unit 410 and the compression guarantee code 430 is insufficient for the predetermined compressed block 400. A portion by which the size of the compressed block 400 is not reached is padded with the padding data 420. In the case where the size of the compressed data unit 410 is greater than the size of the compressed block 400, it suffices to reduce the number of SSD blocks as a compression target such that the size of the compressed data unit 410 is made smaller than the size of the compressed block 400.

4) The SSD controller 50 transfers the compressed block 400 to the cache memory 56. Using the ECC circuit 61, the SSD controller 50 adds the ECC 91 to the compressed block 400 to generate a CW. With respect to the FM, the SSD controller 50 indicates a write of the generated CW.

The configuration of a data format described above can prevent one compressed data unit 410 from being divided into two CWs to be stored in the FM. That is, the SSD block 300 is included in one CW even after data compression. Thus, in the case of reading an SSD block, one SSD block can be extracted by reading one CW from the FM through partial read and decompressing the compressed block 400 stored in the CW.

With the second example, excess data transfer and a compression-decompression process that have possibly occurred in the case of the comparative example where the compressed data unit 410 is divided into and stored in two CWs can be prevented. Thus, with the second example, a decrease in response speed can be prevented. Since the consistency of a compressed data unit is checked using the compression guarantee code 430 in the DIF circuit 60 of the FM controller 58 at the time of data read, the reliability with respect to read data is also improved.

Figure 17:
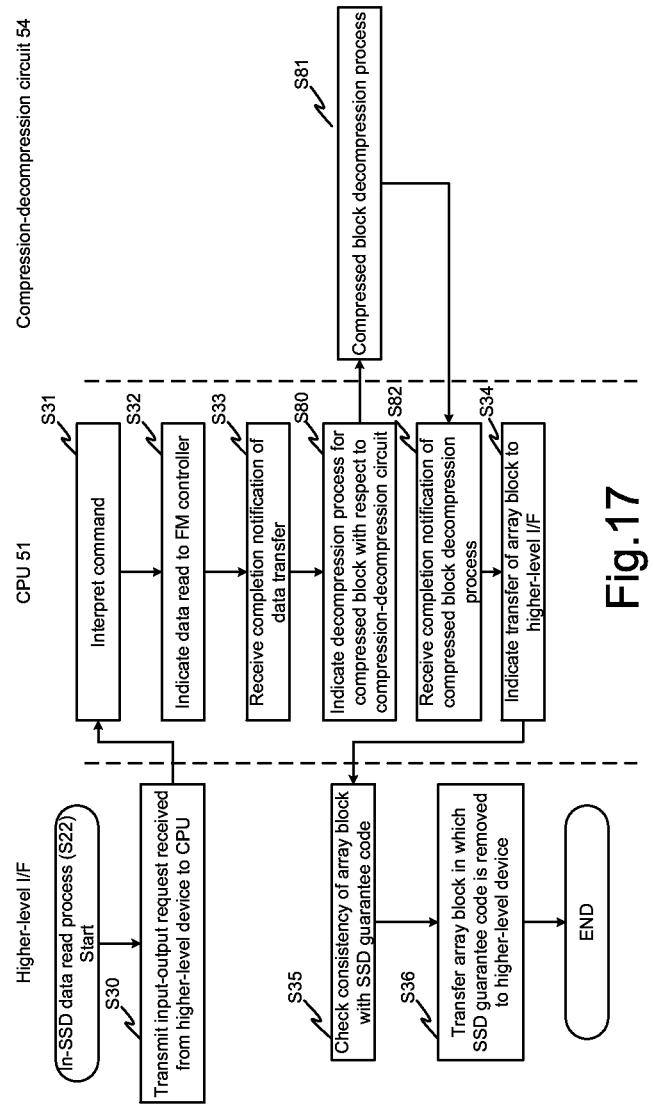
FIG. 17 is an example of a flowchart showing the details of an in-SSD data read process (S22) in the second example.

FIG. 17 is an example of a flowchart showing the details of an in-SSD data read process (S22) in the second example.

In comparison with FIG. 11 according to the first example, FIG. 17 differs in that a decompression process (S80 to S82) for data is added between S33 and S34. Hereinafter, the process between S33 and S44 will be described, and descriptions for other processes similar to FIG. 11 will be omitted.

The CPU 51 receives, from the FM controller 58, a completion notification of data transfer (S33) and indicates a decompression process for a compressed block with respect to the compression-decompression circuit 54 (S80).

The compression-decompression circuit 54 to which the decompression process has been indicated from the CPU 51 executes the decompression process for the compressed block and transmits a completion notification of the process to the CPU 51 (S81). A process in S81 will be described in detail with FIG. 18.

The CPU 51 receives the completion notification of a compressed block decompression process (S82) and proceeds to a process in S34. Processes thereafter are similar to FIG. 11, and therefore description is omitted.

Figure 18:
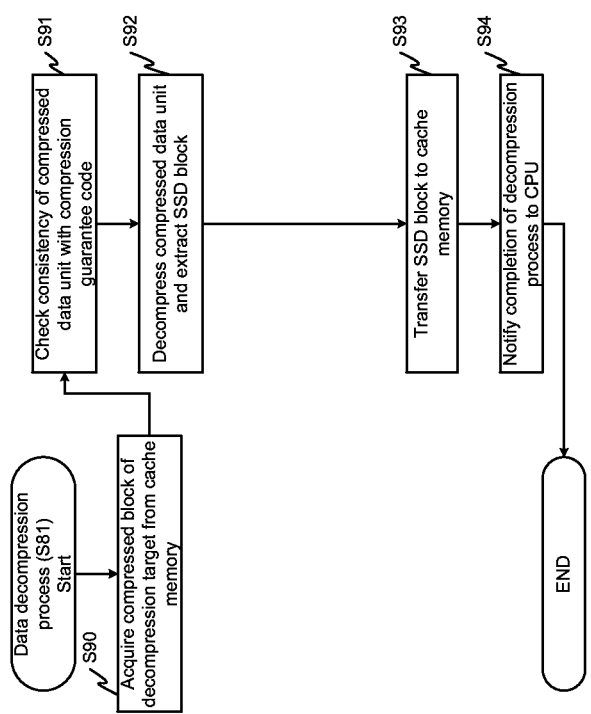
FIG. 18 is an example of a flowchart showing the details of a compressed block decompression process (S81) in the second example.

FIG. 18 is an example of a flowchart showing the details of the compressed block decompression process (S81) in the second example.

In accordance with the indication from the CPU 51, the compression-decompression circuit 54 acquires the compressed block 400 of a decompression target from the cache memory 56 (S90).

The DIF circuit 55 corresponding to the compression-decompression circuit 54 checks the consistency of a compressed data unit using the compression guarantee code 430 (S91).

The compression-decompression circuit 54 decompresses the compressed data unit and extracts one or more SSD block (S92). At this time, the compression-decompression circuit 54 deletes the padding data 420.

The compression-decompression circuit 54 transfers the extracted SSD block to the cache memory 56 (S93). The compression-decompression circuit 54 notifies completion of the decompression process with respect to the CPU 51 (S94) and terminates the process (END).

In the above, the compression-decompression circuit 54 may, without adding the compression guarantee code 430, pad that portion with the padding data 420.

In both Examples 1 and 2, the SSD 40 handled as a final storage medium has been described as one example. However, a similar configuration may be applied in the SSD 34 used as a cache memory.

The examples described above are exemplifications for illustration of the present invention and not intended to limit the scope of the present invention only to those examples. Those skilled in the art can carry out the present invention in various other forms without departing from the gist of the present invention.

REFERENCE SIGNS LIST

1 Storage system
10 Host computer
30 Storage apparatus
31 Array controller device
40 SSD

The invention claimed is:

1. A storage apparatus coupled to a higher-level device, comprising:
   a storage medium including a plurality of pages, which are units of reading and writing data; and
   a medium controller configured to control read and write of data requested from the higher-level device to the storage medium,
   wherein the storage medium includes a page buffer configured to store data to be read or written in units of pages, and
   wherein the medium controller is configured to:
   generate a plurality of first data blocks, each including a data block received from the higher-level device and a guarantee code of the data block;
   generate a plurality of second data blocks of a predetermined size, each second data block, of the plurality of second data blocks, consists of one or more undivided first data blocks, of the plurality of first data blocks, and each of the first data blocks are captured in the second data blocks in an undivided state;

generate respective correction codes corresponding to each of the generated plurality of second data blocks, generate and store, in the page buffer of the storage medium, a third data block, including a generated second data block, of the plurality of generated second data blocks, and the corresponding correction code, wherein the corresponding generated correction code is added to the second data block, and write the third data block stored in the page buffer in a page of the storage medium, which is a write destination, of the plurality of pages.

2. The storage apparatus according to claim 1, wherein the second data block includes a data group including at least a compressed data unit that includes one or more compressed first data blocks, in a case where a size of the data group is less than the predetermined size, the data group includes padding data such that a total of the size of the data group and a size of the padding data is equal to the predetermined size.

3. The storage apparatus according to claim 2, wherein the data group is configured of the compressed data unit and a compression guarantee code that is a guarantee code for the compressed data unit.

4. The storage apparatus according to claim 1, wherein the predetermined size is N times, where N is a positive integer, a size of a first data block, of the plurality of data blocks.

5. The storage apparatus according to claim 1, wherein, in a case where a total size of two or more consecutive first data blocks, of the plurality of first data blocks, exceeds the predetermined size, a certain second data block, of the plurality of second data blocks, is configured of a data block other than a last first data block out of the two or more consecutive first data blocks and padding data added such that a total of a size of the data unit and a size of the padding data is equal to the predetermined size, and a beginning of a data unit of a second data block, of the plurality of second data blocks, subsequent to the certain second data block is the last first data block.

6. The storage apparatus according to claim 1, wherein the storage medium is configured to temporarily store data read from the page in the page buffer, and the storage controller is configured to:
acquire the third data blocks from data of the page stored in the page buffer of the storage medium;
extract a second data block subjected to a correction process using the correction code from the acquired third data block;
extract a first data block from the extracted second data block; and transmit a data block included in the extracted first data block to the higher-level device.

7. The storage device according to claim 1,
wherein, when a read request as to one of the first data blocks is received from the higher-level device, the medium controller is configured to read out a single one of the third data blocks including the requested first data block for the read request, perform a correction process the one or more of the first data blocks included in the read third data block using a correction code included in the read third data block, and transmit the requested first data block for the read request on which the correction process has been performed to the higher-level device.

8. A storage apparatus, comprising:
a storage controller coupled to a host computer;
a RAID group including a plurality of storage devices, coupled to the storage controller,
wherein each storage device includes a storage medium including a plurality of pages, which are units of reading and writing data, and a medium controller configured to control read and write of data requested from the storage controller to the respective storage medium,
wherein the storage controller is configured to transmit a data unit including a data block based on data received from the host computer and a guarantee code for the data block to a storage device, which is a transmission destination of the data unit, of the plurality of storage devices, and
wherein a first data block, of the plurality of first data blocks, includes the data unit received from the storage controller and the guarantee code added to the received data unit,
wherein the medium controller of the transmission destination storage device is configured to:
generate a plurality of second data blocks of a predetermined size, each second data block, of the plurality of second data blocks, consists of one or more undivided first data blocks, of the plurality of first data blocks, and each of the plurality of first data blocks are captured in the second data blocks in an undivided state;
generate respective correction codes corresponding to each of the generated plurality of second data blocks,
generate and store, in the page buffer of the storage medium, a third data block, including a generated second data block, of the plurality of generated second data blocks, and the corresponding correction code, wherein the corresponding generated correction code is added to the second data block, and
write the third data block stored in the page buffer in a page of the storage medium, which is a write destination, of the plurality of pages.

9. A data control method for a storage apparatus including a storage medium including a plurality of pages, which are units of reading and writing data, the control method comprising:
generating a plurality of first data blocks including a data block received from a higher-level device and guarantee code of the data block;
generating a plurality of second data blocks of a predetermined size, each second data block, of the plurality of second data blocks consists of one or more undivided first data blocks, of the plurality of first blocks, each the plurality of first data blocks are captured in the second data blocks in an undivided state;
generate respective correction codes corresponding to each of the generated plurality of second data blocks;
generating a third data block, including a generated second data block, of the plurality of generated second data blocks, and the corresponding correction code, wherein the corresponding generated correction code is added to the second data block;
storing the third data block in a page buffer configured to store data to be read or written in a unit of a page; and
writing the third data block stored in the page buffer in a page, which is a write destination, out of the plurality of pages of the storage medium.

* * * * *